United States Patent [19]

Knudsen et al.

[11] Patent Number: 5,121,869

[45] Date of Patent: Jun. 16, 1992

[54] APPARATUS FOR SOLDER JOINING METAL TAPES

[75] Inventors: Bruce A. Knudsen, Amsterdam; Robert J. Zabala, Schenectady; Mark G. Benz, Burnt Hills, all of N.Y.; Lee E. Rumaner, Seattle, Wash.; Neil A. Johnson, Schenectady, N.Y.

[73] Assignee: General Electric Company, Schenectady, N.Y.

[21] Appl. No.: 767,448

[22] Filed: Sep. 30, 1991

[51] Int. Cl.[5] .................. B23K 1/08; B05C 3/02; B05C 3/12

[52] U.S. Cl. .................... 228/4.1; 228/37; 118/405; 118/419

[58] Field of Search .............. 228/4.1, 6.1, 37; 118/405, 419

[56] References Cited

U.S. PATENT DOCUMENTS

| | | | |
|---|---|---|---|
| 312,451 | 2/1885 | Ehret, Jr. ............... | 118/419 |
| 2,382,868 | 8/1945 | Fink ..................... | 118/405 |
| 2,558,093 | 6/1951 | Kinney, Jr. ............. | 228/199 |
| 2,827,809 | 3/1958 | Beam .................... | 228/4.1 |
| 3,650,455 | 3/1972 | Rutter et al. ........... | 228/4.1 |

Primary Examiner—Kurt Rowan
Assistant Examiner—Jeffrey T. Knapp
Attorney, Agent, or Firm—James E. McGinness; James C. Davis, Jr.; James Magee, Jr.

[57] ABSTRACT

An apparatus for solder joining metal tapes to form laminated metal tapes comprises an alignment box having a base and a sidewall means extending therefrom to define a tapered inner channel extending through the box. The tapered channel having an entrance end and narrowing to an exit end. At least one tapered wall extending from the base and within the inner channel to define subchannels that are spaced at the entrance end and converge into the inner channel before the exit end. The sidewall means and tapered wall extending from the base to respective wall tops, and a cover extending over the channel and subchannels is mounted on the wall tops. The base, sidewalls, inner wall, and cover being configured to form the channel and subchannels to have a first preselected distance between the base and cover that is greater than the width of the tapes. A second preselected distance between oppositely facing walls bordering the subchannels that is greater than the thickness of the tapes, and a third preselected distance between oppositely facing walls at the exit end that is greater than the thickness of the laminated tapes. A solder duct means mounted on the box for directing molten solder into the inner channel to flow from the exit end to the entrance end. The solder duct means having a slot extending therethrough and aligned with the exit end. A seal means mounted on the solder duct means adjacent the slot for minimizing solder escaping from the slot while solder coated tapes pass therefrom, and a wiper means mounted on the solder duct means and positioned from the seal means removes excess solder from tapes passing through the seal means.

11 Claims, 4 Drawing Sheets

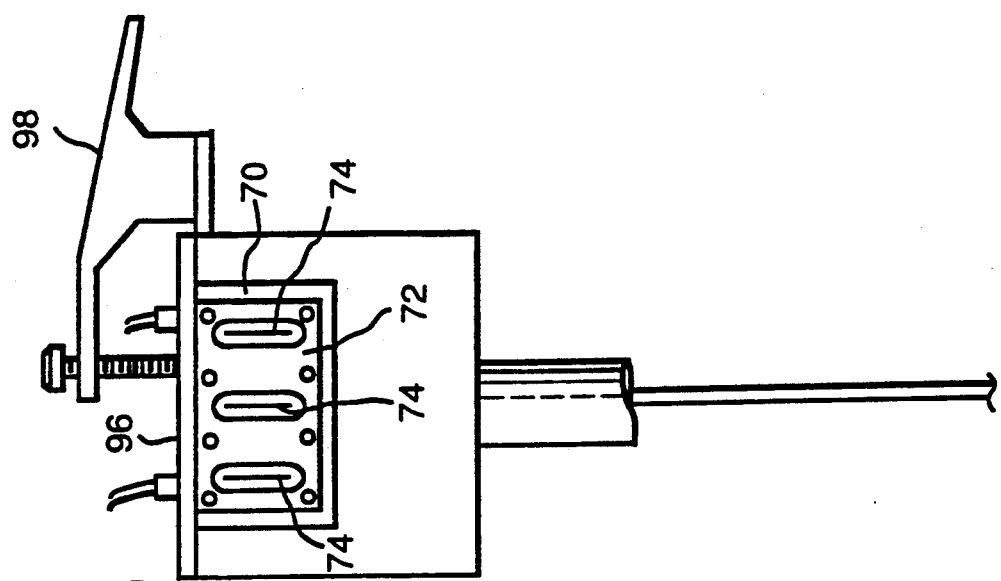
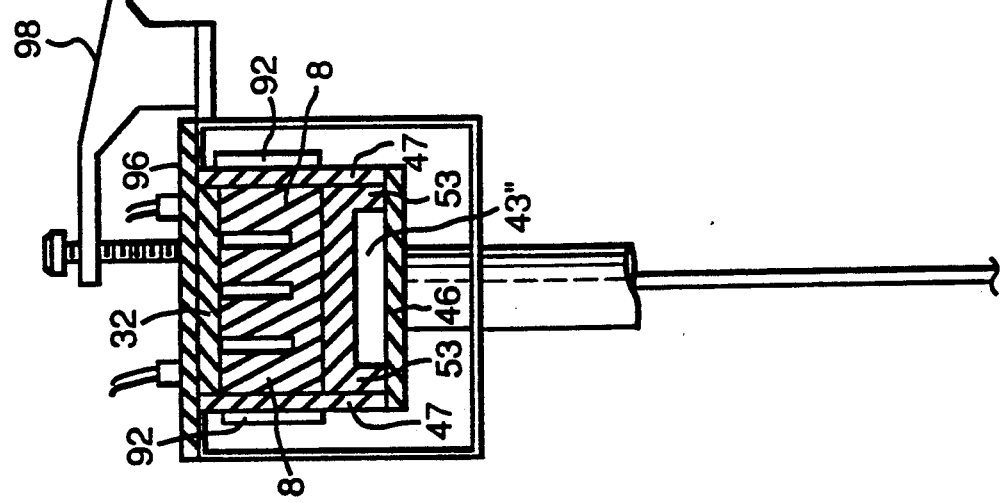
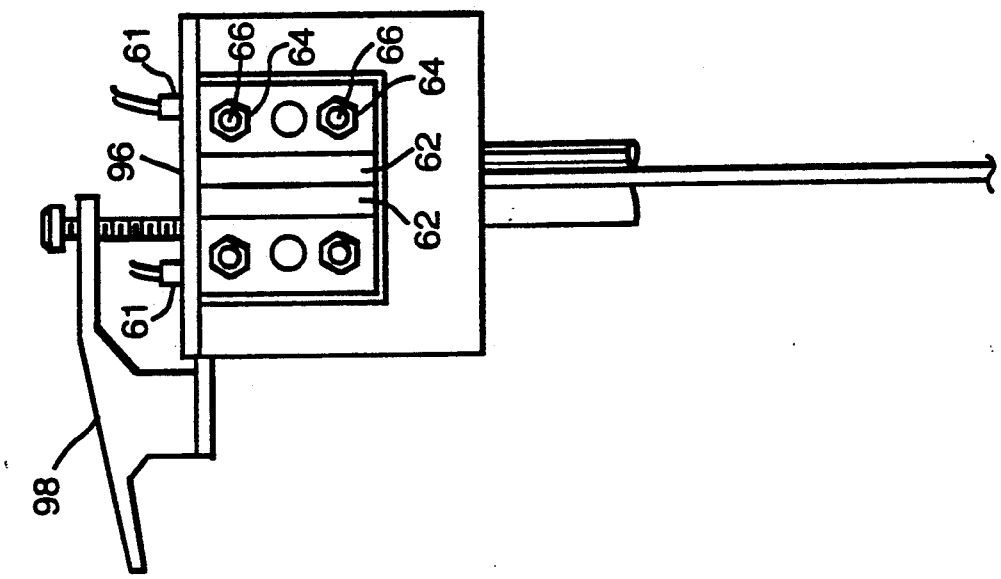

APPARATUS FOR SOLDER JOINING METAL TAPES

BACKGROUND OF THE INVENTION

This invention relates to an apparatus for solder joining metal tapes in a continuous tape laminating apparatus.

Soldering has been defined as metal coalescence below about 800° F. As a result, soldering facilitates joining parts while minimizing damage from heating. Solder alloys are comprised of tin and lead, and the tin component reacts with metals to be joined to form a metallurgical bond. In many soldering systems, an intermetallic compound is developed at the interface between the solder and the base metal, producing an essentially complete metallurgical joint. The cleanliness and chemical composition of the surfaces to be joined are critical to the process. For example, flux can be used to insure that the base metal is sufficiently cleaned to provide adequate spread and flow of the soldering alloy to promote joint formation. However, when a flux is not used surface cleanliness, e.g., freedom from surface oxides, is critical to joint formation.

One application that has been disclosed for solder joined metal tapes is for laminated superconducting tapes, for example disclosed in U.S. Pat. No. 3,537,827. Briefly described, the laminated superconducting tape is comprised of a brittle triniobium tin superconducting layer bonded between outer laminae of non-superconductive metals having a coefficient of thermal expansion greater than that of the triniobium tin inner layer. The outer laminae are bonded integrally to each side of the triniobium tin inner layer by soldering. As a result, the triniobium tin inner layer is in a state of mechanical compression which results from the fact that the outer laminae are in a state of mechanical tension.

Uniform solder joining of the outer laminae to the relatively brittle inner layer provides benefits, such as, improved thermal conductivity for cooling of the superconducting core of the tape, improved formability of the tape, and greater resistance to handling damage. For some applications the laminated tape must have a uniform cross section, for example to enable uniform winding of the tape to form coils. Therefore, it is desirable to solder the metal tapes to form a uniform solder joint, and a laminated tape having a uniform cross-section with a smooth surface finish in a continuous operation. However, imperfections in the tapes that are to be laminated such as camber or wavy edge cause misalignment of the tapes in the width dimension, oxidized tape surface causes dewetting and poor solder bonding, and particles in the solder such as dross (tin oxide) or intermetallic compounds (CuSn) can cause non-uniform cross-sections and excessively rough surface finish defects in the laminated tape.

Excessive time at the soldering temperature, about 250° C., can produce softening of the outer laminate. Since yielding of the outer laminate will cause fracture of the relatively brittle superconductive inner laminate, it is desirable to maintain the yield strength of the outer laminate as high as possible. Therefore it is desirable to minimize the time the tapes are at the soldering temperature.

It is an object of this invention to provide an apparatus for solder joining metal tapes to form a laminated metal tape.

It is another object of this invention to provide an apparatus for solder joining metal tapes symmetrically aligned in the width dimension.

It is another object of this invention to provide an apparatus that aligns metal tapes symmetrically in the width dimension having nonuniformities that cause misalignment of the tapes such as camber or wavy edge.

It is another object of this invention to provide an apparatus for solder joining metal tapes rapidly so that the outer laminae is at the soldering temperature for a minimum time to reduce softening of the outer laminae.

It is another object of this invention to form an apparatus for solder joining metal tapes with a high uniformity of solder bonding across the entire surface of the facing tapes.

It is another object of this invention to provide an apparatus for continuously solder joining metal tapes while minimizing bending or abrasion of the tape surface.

It is another object of this invention to provide an apparatus for continuously solder joining metal tapes.

BRIEF DESCRIPTION OF THE INVENTION

The apparatus of this invention joins metal tapes to form laminated metal tapes in a continuous tape laminating apparatus. As used herein the term "tape" is a body having a length, width, and thickness dimension with major surfaces in the length and width dimension. The apparatus is comprised of an alignment box having a base and a sidewall means extending therefrom to define a tapered inner channel extending through the box. The tapered channel having an entrance end and narrowing to an exit end. At least one tapered wall extends from the base and within the inner channel to define subchannels that are spaced at the entrance end and converge into the inner channel before the exit end. The sidewall means and tapered wall extend from the base to respective wall tops. A cover extending over the channel and subchannels is mounted on the wall tops.

The base, sidewalls, inner wall, and cover are configured to form the channel and subchannels to have a first preselected distance between the base and cover that is greater than the width of the tapes, a second preselected distance between oppositely facing walls bordering the subchannels that is greater than the thickness of the tapes, and a third preselected distance between oppositely facing walls at the exit end that is greater than the thickness of the laminated tape.

A solder duct means is mounted on the box for directing molten solder into the inner channel to flow from the exit end to the entrance end. The solder duct means having a slot extending therethrough and aligned with the exit end that is larger than the cross-section of the laminated tape. A seal means is mounted on the solder duct means adjacent the slot for minimizing solder escaping from the slot while solder coated tapes pass therefrom. A wiper means mounted on the solder duct means and positioned from the seal means removes excess solder from tapes passing through the seal means. Preferably, the seal means and wiper means are compliant so that minor sized particles, for example up to about 20 microns, having minimal effect on the tape performance can pass therethrough.

BRIEF DESCRIPTION OF THE DRAWINGS

FIG. 7 is an end view of the apparatus in FIG. 5 showing the entrance end.

FIG. 8 is a cross section of an end view from the entrance end of the apparatus in FIG. 5.

FIG. 9 is an end view of the apparatus in FIG. 5 showing the exit end.

DETAILED DESCRIPTION OF THE INVENTION

Superconducting tapes and the method of forming the superconductor on such tapes are well known. For example British patents 1,342,726 and 1,254,542 incorporated by reference herein, disclose improved superconducting tapes and methods of forming the improved tapes. The '827 referenced above discloses improvements in laminating superconductive tapes. In addition, triniobium tin tapes are well known in the art being described, for example, in "Superconducting Properties of Diffusion Processed Niobium-Tin Tape," M. Benz, I.E.E.E. Transactions of Magnetics, Vol. MAG-2, No. 4, December 1966, pp 760-764, incorporated by reference herein.

A method of forming a continuous length of triniobium tin tapes is briefly described by making reference to FIGS. 1-4. A niobium tape 2 comprised of up to about 5 atomic percent of a metal selected from the group consisting of zirconium, aluminum, hafnium, titanium, and vanadium, and up to about 5000 parts per million oxygen is contacted with a molten tin bath comprised of up to about 45 weight percent copper, up to about 25 weight percent lead, and the balance tin to form a coating 4. Alternatively, the coating may be deposited onto the niobium tape at least partly by plating, or by electrolytic or chemical processes.

Figure 1:
FIG. 1 is a side view of a niobium tape.
Figure 2:
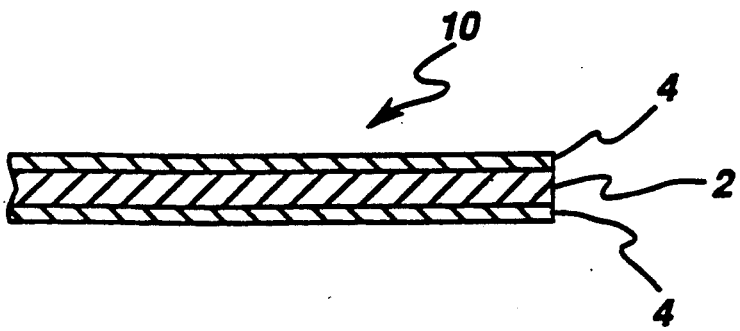
FIG. 2 is a side view of a niobium tape coated with a tin alloy.
Figure 3:
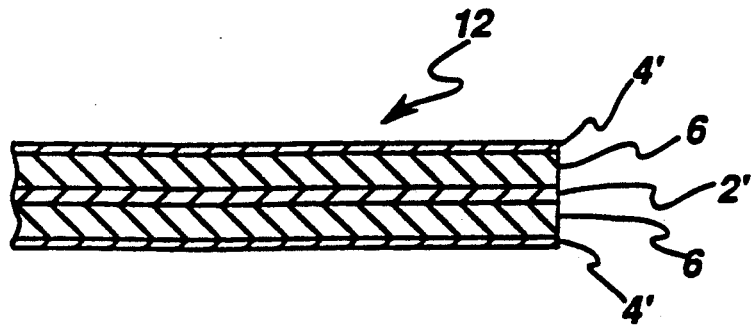
FIG. 3 is a side view of a reaction annealed triniobium tin tape.
Figure 4:
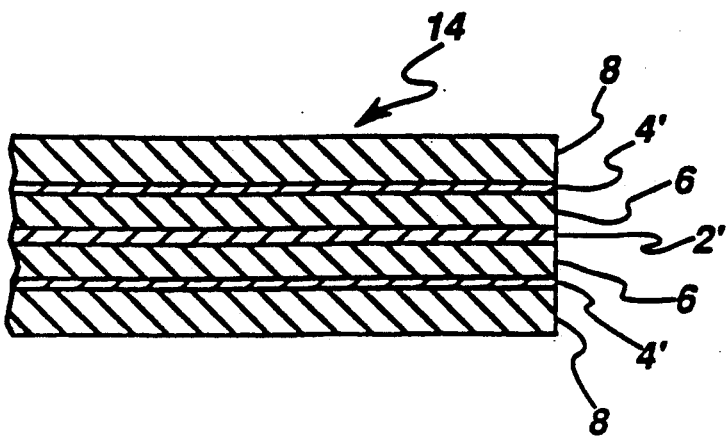
FIG. 4 is a side view of a reaction annealed triniobium tin tape with non-superconducting outer laminae.

The coated niobium tape 10 is reaction annealed at about 850° to 1100° C. to react the niobium substrate with the coating and form laminae 6 of triniobium tin on triniobium tin tape 12. Excess coating 4', as shown in FIG. 3, covers the triniobium tin laminae 6. Tin reacts with niobium to form the triniobium tin, and excess coating 4' becomes enriched in any copper or lead that was in coating 4. The remaining niobium tape 2, is reduced in thickness from reaction with the coating 4 to form the triniobium tin laminae 6. Non-superconducting outer laminae 8 are bonded to the triniobium tin tape 12 by soldering to form a laminated triniobium tin tape 14 having improved strength and formability. The apparatus of this invention is suitable for solder joining the outer laminae 8 continuously onto triniobium tin tape 12.

Figure 5:
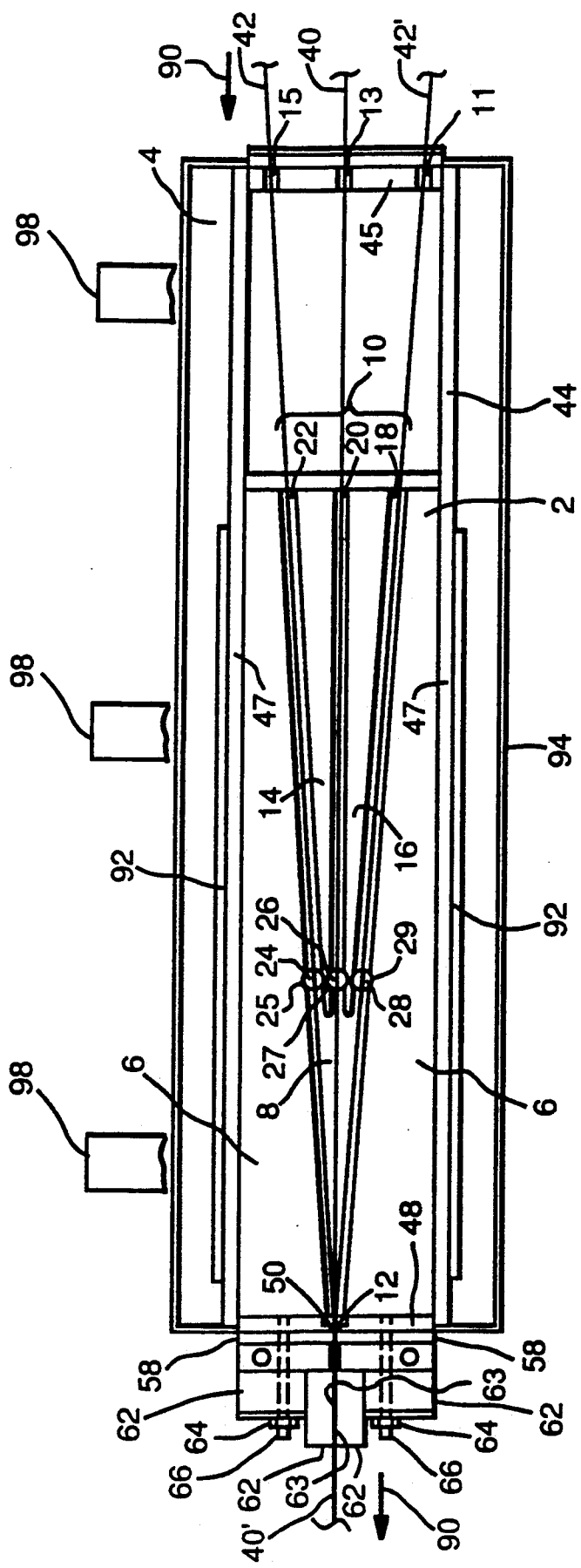
FIG. 5 is a cross section of a top view of an apparatus for solder joining metal tapes.
Figure 6:
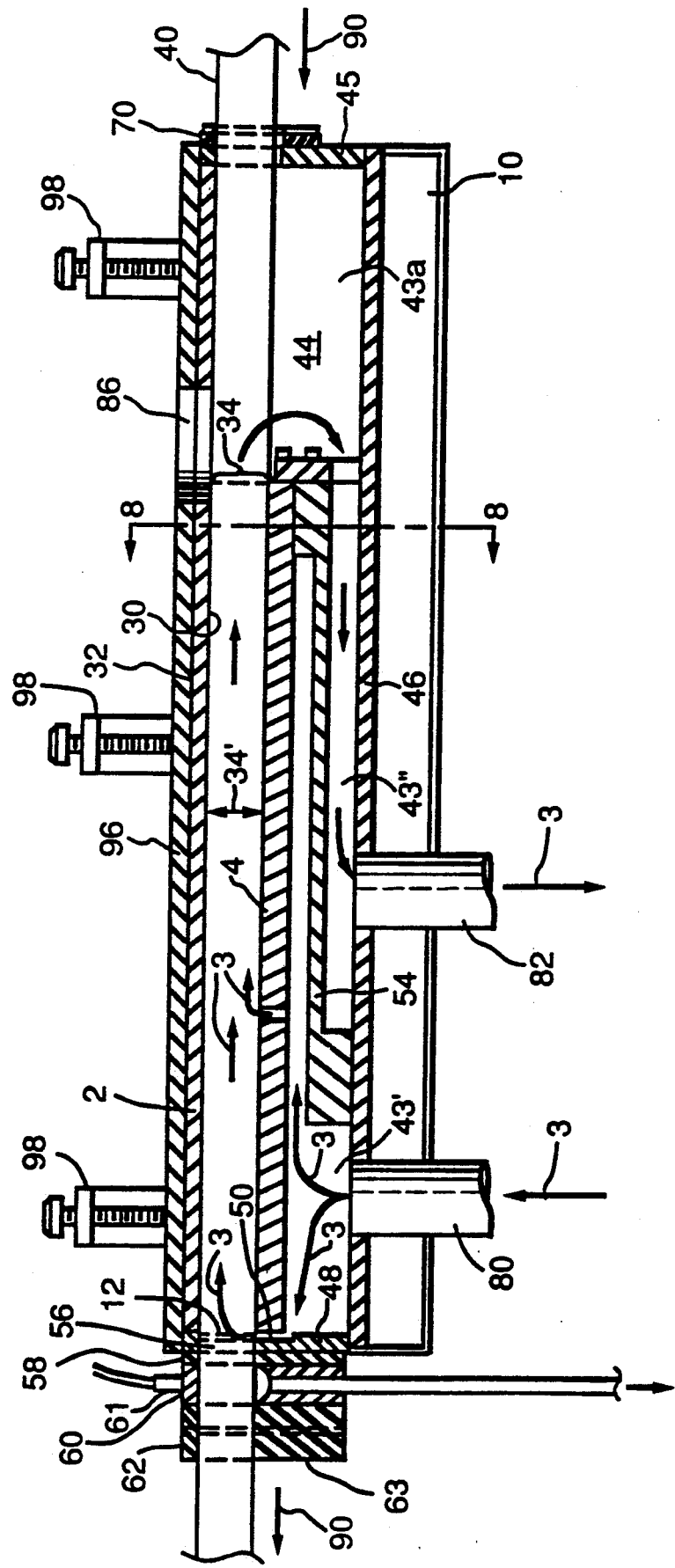
FIG. 6 is a cross section of a side view of the apparatus in FIG. 5.

Referring to FIGS. 5 and 6, the apparatus is comprised of a rectangular alignment box 2 formed from a material resistant to reaction with molten solder, such as tool steel or stainless steel. Preferably, the tool steel has an adherent oxide surface layer, such as a blue oxide formed thereon. The alignment box 2 has a base 4, and sidewall means 6 extending therefrom to form a tapered inner channel 8. Tapered channel 8 has an entrance end 10, and narrows to an exit end 12. Tapered inner walls 14 and 16 extend from the base and within the inner channel to define subchannels 18, 20, and 22 that are spaced at the entrance end, and converge into inner channel 8 before the exit end 12. The space between inner walls 14 and 16, and sidewalls 6 and inner walls 14 and 16 is the width of subchannels 18, 20, and 22. The subchannel width is greater than the thickness of the tapes to be joined, for example, a subchannel width of about 3 millimeters is suitable for tapes having a thickness of about 20 to 200 microns.

Referring to FIG. 5, a triniobium tin tape 40, can be laminated with tapes of copper 42 and 42' to form laminated tape 40'. Bending or mechanical abrasion of the triniobium tin tape 40 is minimized since there is no bending or contact with rollers or shoes within the laminating apparatus of this invention. FIG. 6 is a side view cross-section at the centerline of the alignment box where inner tape 40 can extend through the alignment box.

Base 4 has bores 24, 26, and 28 extending therethrough and positioned between inner tapered walls 14 and 16, and sidewalls 6. Preferably, the diameter of bores 24, 26, and 28 is larger than the width of subchannels 18, 20, and 22, so that the bores extend to sidewalls 6, and inner walls 14, and 16 to form concave surfaces 25, 27, and 29 in the sidewalls and inner tapered walls. The bores extended into the sidewalls ensure that solder flowing through the bores and into the subchannels flows on both sides of the tapes passing therethrough. As a result, wetting of solder on both tape surfaces is promoted, and contact between the tapes and the sidewalls or inner walls is minimized.

Sidewall means 6 and inner walls 14 and 16 extend a preselected distance 34 from base 4 to respective wall tops 30, shown in FIG. 6. The preselected distance 34 is slightly larger than the width 34' of the tapes that are to be joined in the box 2. This preselected distance 34 determines the registry of the laminated tapes. The more distance 34 exceeds the width 34' of the tapes, the more disregistry can be tolerated in laminating the tapes, i.e., the more shape imperfections such as camber in the tape can be tolerated. For example, the preselected distance 34 can be about 625 microns greater than the width 34' of tapes 40, 42, and 42' so that the alignment of the tape edges does not vary by more than 625 microns.

Referring to FIG. 6, a rectangular housing 44 contains box 2 mounted on a solder duct means for directing molten solder into the inner channel 8 and bores 24, 26, and 28 to flow from the exit end to the entrance end of channel 8 and subchannels 18, 20, and 22 as shown by arrows 3, and means for collecting and draining molten solder flowing from the entrance end of alignment box 2.

Rectangular housing 44 is comprised of a bottom plate 46, end plates 45 and 48, and sidewalls 47 (shown in FIG. 8) extending from bottom plate 46 to form an inner cavity 43. Base plate 46 extends beyond the entrance end of alignment box 2 and the sidewalls and first end plate 45 extend therefrom to enclose a first cavity section 43a for collecting molten solder flowing from entrance end 10. First end plate 45 has rectangular holes 11, 13, and 15 (shown in FIG. 5) extending therethrough. Rectangular holes 11, 13, and 15 are larger than the cross-section of the tapes, and aligned with imaginary planes extending from subchannels 18, 20, and 22. Alignment box 2 is mounted on a duct piece 52 having sidewalls 53 (shown in FIG. 8), and a divider wall 54 therebetween separating the portion of channel 43 below box 2 into two duct sections 43' and 43". Solder enters alignment box 2 through first duct section 43', and drains from cavity section 43a through second duct section 43".

Second end plate 48 is mounted at the end of housing 44 opposite the first end plate 45, and adjacent exit end 12. A notch 50 formed in second end plate 48 is aligned with and extends below exit end 12 to provide communication between exit end 12 and first duct section 43'. A slot 56 extending through second end plate 48 at notch 50 is larger than the laminated tape cross-section and is aligned with exit end 12 to provide for passage of the laminated tape therethrough.

A seal means 58 is mounted on the second plate 48 over slot 56 to minimize solder escaping from slot 56 while allowing solder coated tapes to pass therethrough. A suitable seal means 58 can be formed from a resilient material resistant to molten solder, such as silicone rubber or TEFLON synthetic resin polymer. For example, a sheet of silicone rubber is razor cut on a line to form a slit aligned with slot 56. A suitable silicone sheet is about 3 millimeters thick, and is at least large enough to extend over and beyond slot 56. Optionally, a second drain means 60 formed from material resistant to molten solder such as stainless steel is mounted adjacent seal means 58 and provides for draining of solder that passes through seal means 58. Conventional resistance heating rods 61 in second drain means 60 heat the drain means so that solder escaping from seal means 58 will drain therefrom.

A wiper means 62 is positioned from the seal means to remove excess solder from the tapes exiting the seal means by mounting adjacent the second drain means 60. Wiper means 62 can be formed from any material resistant to molten solder and rigid enough to wipe excess solder from the laminated tape. Suitable wiper means 62 can be formed from metal such as steel, iron, nickel alloys, and the like, fiberglass, TEFLON synthetic resin polymer, silicone rubber, and boron nitride. Preferably, wiper means 62 is formed from a material that is also compliant, such as the silicone rubber. A suitable silicone rubber is temperature resistant to about 250° C., and has a durometer hardness of at least about shore A 40. A suitable silicone rubber is GE RTV silicone rubber, or high temperature gasket GEC560, GE, Waterford, N.Y.

Wiping means 62 is configured to present a wiping surface 63 that extends beyond the width of tape 40', and from second drain 60 a distance sufficient to wipe excess solder from laminated tape 40', for example, about 2 centimeters. Wiping means 62 is formed to have a smooth wiping surface 63 to apply a uniform and even pressure across the surface of laminated tape 40' facing wiping surface 63. For example, wiping means 62 formed from silicone rubber can be cast as a monolithic L-shaped member, or two sheets of silicone rubber sheet can be joined together with the RTV silicone rubber to form the L-shaped member shown in FIG. 5. It is further contemplated that wiping means 62 can be configured as two rollers (not shown) positioned to apply a compressive force to laminated tape 40' after seal means 58 to remove excess solder from the laminated tape. Preferably, the rollers have at least an outer layer of a compliant material such as the silicone rubber bonded on the roller to permit small particles, for example up to about 20 microns, on the laminated tape 40' to pass through the wiping means without causing a substantial increase in the stress applied to the tape. Excess solder wiped from the laminated tape flows into and drains from second drain means 60.

Mounting bolts 66 (shown on FIG. 5) on second end plate 48 extend therefrom through aligned holes in seal means 58, drain means 60, and wiper means 62. Nuts 64 threaded onto bolts 66 are tightened to bias seal means 58, drain means 60, and wiper means 62 into sealing engagement with second end plate 48.

Means for providing a preselected atmosphere over the alignment box are further shown by making reference to FIGS. 6 and 7. A silicone sheet 70 is mounted on first end plate 45 by bolted attachment through metal cover plate 72. Silicone sheet 70 has slits 74 extending therethrough and in alignment with the rectangular holes 11, 13, and 15 in the first end plate. Cover plate 32 configured to extend between end plates 45 and 48, and sidewalls 47 is mounted on the wall tops of box 2. Preferably, housing 44 is assembled with molten solder resistant seals, for example of GERTV red high temperature silicone rubber such as RTV 106, between the base, side walls, end plates and cover. Optionally, a viewing port 86 extending through cover 32 at a position over the entrance end of box 2 has a mating cylindrical tube (not shown) extending therefrom to a viewing glass sealed thereon. A gas inert to the molten solder such as nitrogen or argon can be introduced into housing 44 through a conventional gas valve (not shown) extending from the cylindrical tube.

Optionally, housing 44 has conventional heaters 92 such as calrod heaters attached thereto to maintain the temperature of the housing at the soldering temperature. The heaters 92 and housing 44 are then enclosed in an outer housing 94. Conventional insulation such as fiberglass or Fiberfrax alumina fibers can be placed between housing 44 and outer housing 94. Outer lid 96 configured to mate with housing cover 32 and extend over housing 44 is sealed thereon with the RTV silicone rubber. Conventional clamps 98 bias outer lid 96 and housing cover 32 against housing 44 to form a seal that minimizes leakage of molten solder flowing in housing 44.

In operation, a conventional molten metal pump system provides a flow of molten solder through pipe 80 and into first duct 43'. Suitable molten solder pump systems such as a wave solder pump system can be obtained from Wenesco, Chicago, Ill. The molten solder passes from first duct 43' through notch 12 and bores 24, 26, and 28 into channel 8 and subchannels 18, 20 and 22 flowing in the direction from the exit end to the entrance end of channel 8 as shown by arrows 3. The tapes enter the housing 44 at seal means 70 and enter the alignment box at the entrance end 10, passing in the direction of arrow 90. In other words, the molten solder passes in the direction of arrows 3 counter-current to the direction 90 that the tapes are passing.

The counter-current solder flow provides a washing action that washes particles such as dross and copper-tin intermetallics from the alignment box and into the cavity 43a and out of the alignment box through drain cavity 43" and out through pipe 82, as shown by the direction of arrows 3. Pipe 82 returns the solder to the molten solder pump system. As a result, the deposition of particles in the solder onto the laminated tape is minimized. The particles are washed out of the alignment box to minimize particle accumulation and buildup, and the formation of larger particle agglomerations. Particles large enough to cause excessive surface roughness, poor bonding of the laminate to the tape, or that alter the cross section so that the tape does not wind evenly are washed away by the counter-current molten solder flow. The flow of molten solder at notch 12 also provides for washing of particle buildup occurring at seal means 58. Wiper means 62 removes excess solder from the laminated tape, and smooths particles that are deposited on the tape. Preferably, wiper means 62 is formed from a compliant material such as silicon rubber so that minor size particles that do not affect the laminated tape performance pass through the compliant wiper means.

Wiper means 62 apply a force to laminated tape 40' to remove excess solder from the laminated tape. Additional pressure can be applied to wiping means 62 by conventional means (not shown) for applying a compressive force to wipers 62' such as electric servo motors, vacuum motors, or air activated grippers, for example available from PHD, Inc., Fort Wayne, Ind. Suitable air grippers are described in U.S. Pat. No. 4,607,873, incorporated by reference herein.

Although the apparatus above has three subchannels for solder joining three tapes, it should be understood that the apparatus of this invention can have fewer subchannels, i.e. two, or can have more subchannels, e.g. five or more, by either subtracting or adding additional inner tapered walls in the channel of the alignment box.

What is claimed is:

1. An apparatus for solder joining at least two metal tapes having a length, width, and thickness dimension in a continuous laminating apparatus to form a laminated metal tape comprising:

an alignment box having a base and a sidewall means extending therefrom to define a tapered inner channel extending through the box, the tapered channel having an entrance end and narrowing to an exit end, at least one tapered wall extending from the base and within the inner channel to define subchannels that are spaced at the entrance end and converge into the inner channel before the exit end, the sidewall means and tapered wall extending from the base to respective wall tops, and a cover extending over the channel and subchannels mounted on the wall tops, the base, sidewalls, inner wall, and cover being configured to form the channel and subchannels to have a first preselected distance between the base and cover that is greater than the width of the tapes, a second preselected distance between oppositely facing walls bordering the subchannels that is greater than the thickness of the tapes, and a third preselected distance between oppositely facing walls at the exit end that is greater than the thickness of the laminated tape;

a solder duct means mounted on the box for directing molten solder into the inner channel to flow from the exit end to the entrance end, the solder duct means having a slot extending therethrough and aligned with the exit end that is larger than the cross-section of the laminated tape;

a seal means mounted on the solder duct means adjacent the slot for minimizing solder escaping from the slot while solder coated tapes pass therefrom; and a wiper means mounted on the solder duct means and positioned from the seal means removes excess solder from tapes passing through the seal means.

2. An apparatus for solder joining at least two metal tapes having a length, width, and thickness dimension in a continuous laminating apparatus to form laminated metal tapes comprising:

an alignment box having a base and a sidewall means extending therefrom to define a tapered inner channel extending through the box, the tapered channel having an entrance end and narrowing to an exit end, at least one tapered wall extending from the base and within the inner channel to define subchannels that are spaced at the entrance end and converge into the inner channel before the exit end, the sidewall means and tapered wall extending from the base to respective wall tops, and a cover extending over the channel and subchannels is mounted on the wall tops, the base, sidewalls, inner wall, and cover being configured to form the channel and subchannels to have a first preselected distance between the base and cover that is greater than the width of the tapes, a second preselected distance between oppositely facing walls bordering the subchannels that is greater than the thickness of the tapes, and a third preselected distance between oppositely facing walls at the exit end that is greater than the thickness of the laminated tapes;

a solder duct means mounted on the box for directing molten solder into the inner channel to flow from the exit end to the entrance end, the solder duct means having a slot extending therethrough and aligned with the exit end, and drain means for collecting and draining molten solder flowing from the entrance end;

a seal means mounted on the solder duct means adjacent the slot for minimizing solder escaping from the slot while solder coated tapes pass therefrom; and a wiper means mounted on the solder duct means and positioned from the seal means removes excess solder from tapes passing through the seal means.

3. An apparatus according to claim 2 wherein the base has at least two bores extending therethrough and in communication with the solder duct means to direct molten solder into the inner channel so that the molten solder wets both surfaces of tapes passing through the channel and subchannels.

4. An apparatus according to claim 3 wherein the bores are positioned between the sidewalls and inner wall, having a diameter larger than the distance between oppositely facing walls and extending from the base to the wall top as aligned concave surfaces on the walls.

5. An apparatus according to claim 2 comprised of a second drain means mounted on the duct means and positioned between the seal means and wiper means for draining solder passing from the seal means, the second drain means having heating means for maintaining a preselect temperature therein.

6. An apparatus according to claim 2 comprised of a heating means on the housing for maintaining the housing at a preselected temperature.

7. An apparatus according to claim 2 comprised of enclosing means for providing a preselected atmosphere over the alignment box and means for collecting molten solder flowing from the entrance end.

8. An apparatus according to claim 2 wherein the seal means and wiper means are compliant so that small particles having minimal effect on the tape performance can pass therethrough.

9. An apparatus according to claim 8 wherein the seal means and wiper means are formed from silicone rubber having a durometer hardness of at least about shore A 40, and resistant to temperatures of at least about 250° C.

10. An apparatus according to claim 2 wherein the seal means is a sheet having a slit aligned with the exit end.

11. An apparatus for solder joining metal tapes having a length, width, and thickness dimension in a continuous laminating apparatus to form laminated metal tapes comprising:

an alignment box having a base and a sidewall means extending therefrom to define a tapered inner channel extending through the box, the tapered channel having an entrance end and narrowing to an exit end, two tapered walls extending from the base and within the inner channel to define three subchannels that are spaced at the entrance end and converge into the inner channel before the exit end, the sidewall means and tapered walls extending from the base to respective wall tops, and a cover extending over the channel and subchannels is mounted on the wall tops, the base, sidewalls, inner walls, and cover being configured to form the channel and subchannels to have a first preselected distance between the base and cover that is greater than the width of the tapes, a second preselected distance between oppositely facing walls bordering the subchannels that is greater than the thickness of the tapes, and a third preselected distance between oppositely facing walls at the exit end that is greater than the thickness of the laminated tapes;

a solder duct means mounted on the box for directing molten solder into the inner channel to flow from the exit end to the entrance end, the solder duct means having a slot extending therethrough and aligned with the exit end that is larger than the cross-section of the laminated tape, and drain means for collecting and draining molten solder flowing from the entrance end;

a seal means mounted on the solder duct means adjacent the slot for minimizing solder escaping from the slot while solder coated tapes pass therefrom; and a wiper means mounted on the solder duct means and positioned from the seal means removes excess solder from tapes passing through the seal means.

* * * * *